(12) United States Patent
Shibib

(10) Patent No.: US 6,303,961 B1
(45) Date of Patent: *Oct. 16, 2001

(54) COMPLEMENTARY SEMICONDUCTOR DEVICES

(75) Inventor: Muhammed A. Shibib, Wyomissing, PA (US)

(73) Assignee: Aqere Systems Guardian Corp., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,215

(22) Filed: Apr. 29, 1998

(51) Int. Cl.[7] .............................. H01L 29/76; H01L 29/74
(52) U.S. Cl. ....................... 257/335; 257/107; 257/133; 257/338
(58) Field of Search ................................. 257/107, 133, 257/335, 336, 337, 338, 339, 341, 342, 343, 401, 329; 438/135

(56) References Cited

U.S. PATENT DOCUMENTS

| 5,171,699 | 12/1992 | Hutter et al. | 438/206 |
| 5,374,569 | 12/1994 | Yilmaz et al. | 438/203 |
| 5,381,031 | 1/1995 | Shibib | 257/488 |
| 5,517,046 | * 5/1996 | Hsing et al. | 257/336 |
| 5,541,409 | 7/1996 | Enloe | 250/305 |
| 5,541,429 | 7/1996 | Shibib | 257/329 |
| 5,557,125 | 9/1996 | Shibib | 257/329 |
| 5,576,570 | * 11/1996 | Ohsawa et al. | 257/369 |
| 5,591,657 | 1/1997 | Fujishima et al. | 438/207 |
| 5,670,396 | 9/1997 | Shibib | 438/236 |
| 5,677,558 | * 10/1997 | McGlinchey | 257/370 |

FOREIGN PATENT DOCUMENTS 2-304983 * 12/1990 (JP).

* cited by examiner

*Primary Examiner*—Steven Loke
*Assistant Examiner*—Hung Kim Vu
(74) *Attorney, Agent, or Firm*—Lowenstein Sandler PC

(57) ABSTRACT

A metal-oxide semiconductor device having an enhanced compatibility for use as a complementary device comprises an additional lateral well region interposed between the source and drain region of the device. In one embodiment, the invention comprises a p-channel DMOS which may be integrated simultaneously on a chip with an n-channel DMOS, the p-channel DMOS having an n-type substrate, an upper self-aligned region disposed in a well region of p-type conductivity, a p-type impurity region disposed in the upper well, the well region of p-type conductivity being interposed between the n-substrate and the n-well region. A double-diffused CMOS structure may be fabricated by adding one implantation step to present technology involving fabrication of n-channel devices.

2 Claims, 12 Drawing Sheets

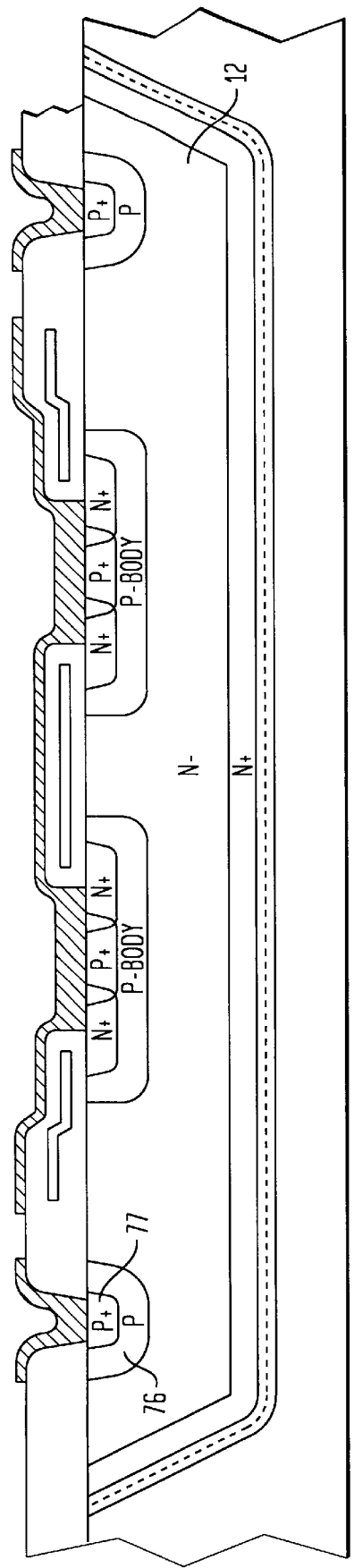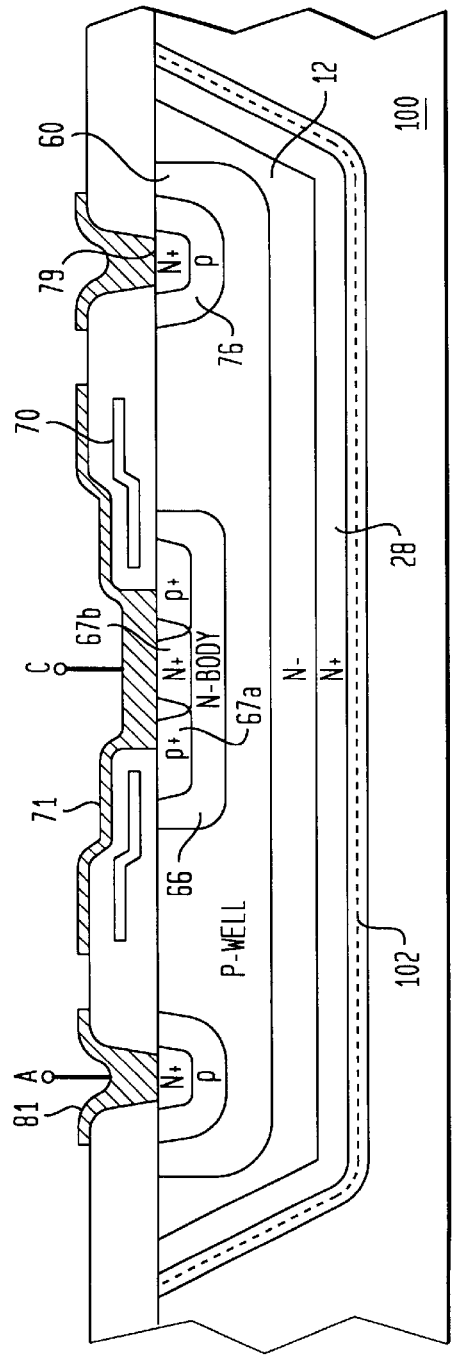

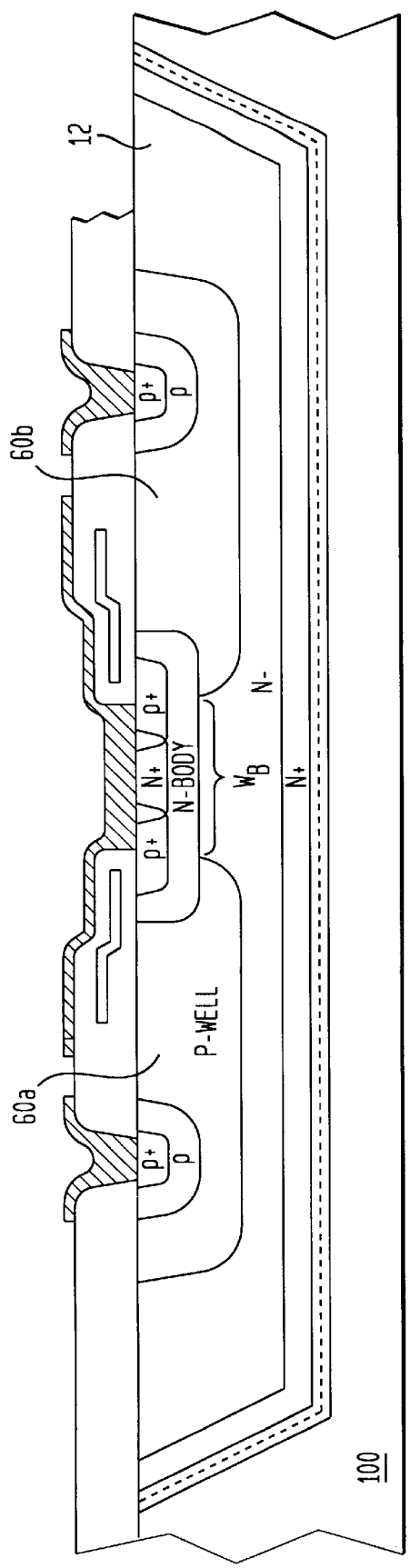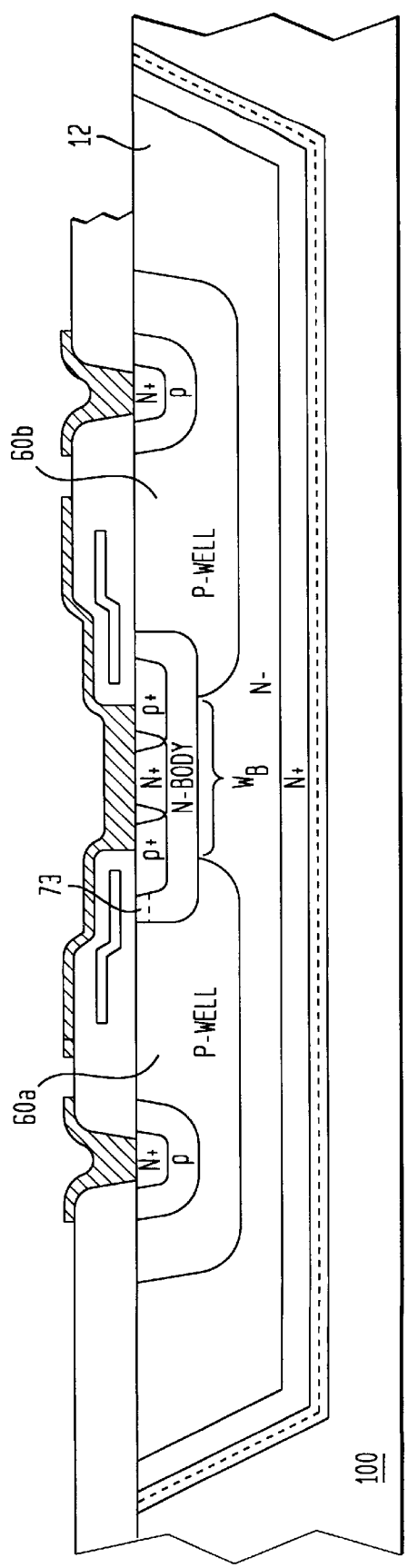

COMPLEMENTARY SEMICONDUCTOR DEVICES

FIELD OF THE INVENTION

The present invention relates to semiconductor devices and, more particularly, to a metal-oxide semiconductor device that has an improved compatibility for use in a CMOS device and may be integrated on a chip with a DMOS of opposite-type conductivity.

BACKGROUND OF THE INVENTION

The metal-oxide semiconductor field effect transistor (MOSFET) is a dominant and important device in fabricating very large-scale integrated circuits, and various types of MOSFETS are known. MOSFET technology basically can be categorized as consisting of NMOS and CMOS technology, the former comprising n-channel MOS devices and the latter comprising n-channel and p-channel devices integrated on the same chip. Other acronyms are used to identify MOSFETs, including DMOS (wherein "D" stands for "diffusion" or "double diffusion"), PMOS (p-channel MOS), IGBT (Insulated Gate Bipolar Transistor), BiCMOS (CMOS having bipolar devices), and DGDMOS (Dual Gate DMOS). Following accepted terminology, the term CMOS denotes that n-channel and p-channel devices are integrated simultaneously on the same chip, and the term CMOS is so used herein.

Various types of semiconductor devices, as well as both n-channel and p-channel devices, may be integrated within a single semiconductor chip. This is made possible by use of device structures and processes which are compatible with the different types of devices included on the chip. However, designing the devices to achieve compatibility typically means that performance of each of the devices will be less than optimal. CMOS devices provide significant advantages in terms of their low power consumption, but they generally require more complex processing as compared with NMOS devices. Also, with present technology, CMOS structures have been confined to low voltage devices operable at less than 5V. N-channel DMOS or IGBT devices operating at medium (10–100) and high (>100) voltages may be made to be complementary with p-channel DMOS devices, but presently this is achieved by separately fabricating the complementary p-channel devices, using different processing steps, which then may be coupled to the n-channel devices. These are not CMOS devices in that they are not integrated simultaneously on one chip.

To illustrate, referring to FIG. 1A, there is shown a cross-sectional view of a prior art n-channel MOS device, without double diffusion. The characteristic features of this basic device comprise a p-type semiconductor substrate 12 having a major surface 14, within which are disposed two n+ regions or bodies 16a, 16b, forming a source and drain, respectively. Overlying the surface 14 is a gate electrode 20, typically fabricated with polysilicon or a combination of polysilicon and silicide ($MoSi_2$), separated from surface 14 by a layer of gate oxide 22. Field oxide layer 24 isolates the source and drain, and a protective layer of glass 34, typically boron phosphorus silicate glass, is disposed over the device. A further silicon nitride layer (not shown), may be disposed over the glass. The channel 23 is defined by the upper portion of the substrate 12, which underlies gate 20. FIG. 1A shows an n-channel device (NMOS), but a p-channel device (PMOS) may be formed following the same schematic by substituting p for n and reversing the polarity of the charges.

FIG. 1B illustrates a basic CMOS structure involving NMOS and PMOS devices integrated on the same chip, following the structure for the MOS of FIG. 1A and using like character numerals to refer to like features. Metallization region 35, typically fabricated with aluminum, may be deposited over the device and etched as desired (as shown), for interconnection of the device structures. The gate of the NMOS device 30 may be connected to the gate of the PMOS device 40. For example, a conductive conduit 38, having contact $V_G$, is shown schematically with hatched lines interconnecting the gates. In processing this CMOS, a p-tub or well 18 is implanted in the n-substrate, enabling formation of the complementary devices in substrate 12. Separate implantation steps are required for forming the p-tub 18, the n+ source and drain regions 16a, 16b, and the p+ source and drain regions 16c, 16d; p-type regions generally are formed by implantation with boron ions, and n-type regions by implantation with arsenic or phosphorus ions. Because of the p-tub 18 and the processing needed to make the PMOS, the number of steps for fabricating the basic CMOS of FIG. 1B is essentially double that for the NMOS of FIG. 1A.

Referring now to FIG. 2A, there is shown a basic embodiment of a double-diffused, n-channel MOS, again with like numerals used to refer to like features as compared with FIGS. 1A–1B. Substrate 12 of n-type conductivity is disposed within a chip 100 and isolated from it by a layer of dielectric material 102, such as silicon dioxide. The substrate 12 has a major surface 14 on which active components are disposed, e.g., gate electrode 20 insulated by gate oxide layer 22. The device here shown comprises spaced-apart, plural source regions connected in parallel. Source regions comprise first doped regions 17 of n-type conductivity, connected by source electrodes 21, and second doped regions 19 of p-type conductivity formed within substrate 12. A region of p+ type conductivity 25 may be implanted beneath source contacts 21, interposed between each of the doped regions comprising the source regions, as also described in U.S. Pat. No. 5,541,429, "Dielectrically Isolated Semiconductor Devices Having Improved Characteristics," issued Sep. 17, 1996 to M. A. Shibib, the inventor herein, assigned to AT&T Corp., a predecessor of the assignee herein, which is incorporated herein by reference.

The second doped regions 19 extend further laterally under gate electrode 20 than first doped regions 17. The portions 23 of the second doped regions 19 extending beyond the first regions 17 beneath the gate oxide comprise the channel regions of the device, and the substrate beneath the surface portion comprises a drain region. Also, a doped body 26 of n+ conductivity forms a supplemental drain region in contact with drain electrode 27. A heavily-doped region 28 may extend laterally along the bottom of the substrate and then vertically upwardly to drain electrode 27. This channel 28 provides a low resistance path for current to the drain electrode for controlling the current as the DMOS devices typically are used in applications involving high voltages and currents.

The Insulated Gate Bipolar Transistors (IGBT) can be identical to the DMOS devices illustrated in FIG. 2A, except that certain high conductivity regions are of opposite type conductivity to that of the substrate 12. For example, FIG. 3A shows a prior art n-channel IGBT device, wherein doped regions 76, 77 are of opposite conductivity to the substrate. Further background concerning MOS devices and the various structures that may be used can be found in the following U.S. patents, all of which issued to the inventor herein, Muhammed Ayman Shibib, were assigned to the present assignee or its predecessor in interest, and are hereby incorporated herein by reference: U.S. Pat. No. 5,670,396, "Method of Forming a DMOS Controlled Lateral Bipolar Transistor," issued Sep. 23, 1997; U.S. Pat. No. 5,557,125, "Dielectrically Isolated Semiconductor Devices Having Improved Characteristics," issued Set. 17, 1996; U.S. Pat. No. 5,541,409, cited above; U.S. Pat. No. 5,395,776, "Method of Making a Rugged DMOS Device," issued Mar. 7, 1995; U.S. Pat. No. 5,381,031, "Semiconductor Device With Reduced High Voltage Termination Area and High Breakdown Voltage," issued Jan. 10, 1995. Bipolar CMOS devices are further described in M. Ayman Shibib & G. T. Jones, "A Cost Effective Smart Power BiCMOS Technology," Proceedings of 1995 International Symposium on Power Semiconductor Devices & IC (1995) (hereinafter the "Symposium article"), also incorporated herein by reference.

As should now be appreciated from the foregoing, fabricating doubly-diffused p-channel devices complementary to n-channel DMOS and IGBT devices involves complicated processing steps. A CMOS such as illustrated in FIG. 1B may be fabricated by implantation or diffusion of the doped regions in the n-type substrate. However, while compatible, this CMOS would not be self-aligned or double-diffused. This results in a less efficient device and need for a larger device to achieve the same performance parameters than if the complementary p-channel device were double-diffused.

Present technology does not permit for fabrication of double-diffused CMOS devices, i.e., double-diffused n- and p-channel devices simultaneously integrated on the same chip, and therefore, CMOS devices have not been available for high voltage applications. Generally, CMOS devices are available for applications of up to 5 volts. As applied to MOS devices in general and as used herein, 0 to 10 volts is considered low voltage; 10 to 100 volts is considered medium voltage; and devices operating at above 100 volts are considered high voltage devices.

Complementary DMOS and IGBT structures may be built on separate chips and interconnected, but fabricating complementary p-channel structures involves processes and technologies differing from those used for the n-channel DMOS and IGBT structures. To make a p-channel device complementary to an n-channel DMOS device, typically the fabrication processes are reversed on a separate chip, that is, instead of an n-type substrate, a p-type substrate is used. An n-well or tub may be implanted or infused into the substrate, and p+ bodies are implanted into the n-well. While this produces a double-diffused, efficient device operating at medium or high voltage, the process is time consuming. Efforts have been made to integrate the fabrication of DMOS and CMOS devices on the same chip. See, e.g., U.S. Pat. No. 5,171,699, "Vertical DMOS Transistor Structure Built in an N-Well CMOS-Based BiCMOS Process and Method of Fabrication," issued Dec. 15, 1992 to Hutter et al., assigned to Texas Instruments, Inc.; U.S. Pat. No. 5,374,569, "Method for Forming a BiCDMOS," issued Dec. 20, 1994 to Yilmaz et al., assigned to Siliconix Inc.; U.S. Pat. No. 5,591,657, "Semiconductor Apparatus Manufacturing Method Employing Gate Side Wall Self-Aligning for Masking," issued Jan. 7, 1997, to Fujishima et al., assigned to Fuji Electric Co., Ltd; all three of the immediately foregoing patents are hereby incorporated by reference.

Additionally, a further drawback with present CMOS technologies involving DMOS devices, beyond the need to use separate chips and technologies, involves use of the p-type base regions. P-type substrates are expensive to form and often call for processing steps incompatible with standard fabrication procedures which are generally based upon n-well implantation processes. Thus, it would be advantageous to provide a double-diffused CMOS having p- and n-channel devices disposed on an n-type region which may be easily fabricated based on available technology.

The invention has utility for better optimizing the features of various devices in integrated circuits of the type described above and in reducing the processing steps for fabricating a variety of MOS and bipolar complementary devices. The invention provides a cost-effective method of fabricating a complementary high voltage MOS and bipolar structure on the same chip and with the same substrate as a DMOS of opposite-type conductivity. Further advantages may appear more fully upon considering the description given below.

SUMMARY OF THE INVENTION

Applicant has discovered that a complementary p-channel DMOS device may be fabricated on the same chip as an n-channel DMOS portion by adding one step to the process of fabricating an n-channel DMOS, the step comprising the addition of an n-type body. A lateral p-well is interposed between the n-type substrate of the p-channel device and the added n-type body, the lateral p-well being in contact with the drain region of the p-channel DMOS.

More particularly with regard to the device features, one embodiment of the improved device comprises a substrate of a first conductivity type and first doping concentration with a major surface. A lateral lower well of a second conductivity type is disposed in the substrate. The lower well has an upper boundary which is contiguous the major surface and defines a drain region. A first conductive region defining a gate is disposed on a portion of the major surface; the gate has a substantially vertical edge defining an opening to the major surface, and it is in contact with the lower well. A first upper well is disposed in the lower well, the first upper well being of the first conductivity type and surrounded on at least a portion of the sides by the lower well. A channel in the first upper well extends to the major surface and is in conductive relation with the gate. At least two impurity regions are disposed in the first upper well. At least one of them is of the first conductivity type, and another is of the second conductivity type. The impurity region of the second conductivity type is in direct contact with the channel for the flow of current of the second conductivity type to the lower well. A second conductive region is disposed on the major surface in contact with the at least two impurity regions. A second upper well of the second conductivity type also is disposed in the lower well, defining a drain extension or supplemental drain region, and it is separated from the first upper well by the lower well. At least one impurity body is disposed in the second upper well, and a third conductive region is disposed on the major surface in contact with this impurity body. With this configuration, the channel in cooperation with the lower well forms a direct passage for the flow of current from the impurity region of the second conductivity type (disposed in the first upper well) to the drain region.

With the inventive technology, a complementary p-channel DMOS, IGBT, or quasi-vertical p-n-p device can be simultaneously integrated on the same chip as a double-diffused n-channel MOS, and vice versa. The invention encompasses a doubly-diffused CMOS device for medium voltage applications.

BRIEF DESCRIPTION OF THE DRAWINGS

For a better understanding of the invention, an exemplary embodiment is described below, considered together with the accompanying drawings, in which:

FIG. 3A is a cross-sectional view of a prior art n-channel IGBT device;

FIG. 3B is a cross-sectional view of an inventive p-channel IGBT device complementary to the n-channel device of FIG. 3A;

FIGS. 6A and 6B illustrate cross-sectional views of alternate embodiments of inventive p-channel DMOS (FIG. 6A) and IGBT (FIG. 6B) devices;

It is to be understood that these drawings are for the purposes of illustrating the concepts of the invention, are not limiting in nature, and are not to scale.

DETAILED DESCRIPTION OF THE INVENTION

Applicant has discovered a complementary p-channel DMOS device may be fabricated by adding one step to the fabrication process for making an n-channel DMOS, thus providing an efficient process for making a p-channel DMOS and enabling the fabrication of complementary NMOS and PMOS devices simultaneously on the same chip using the same n-type substrate. Essentially, the discovery involves use of a lateral p-well above the n-type substrate, in contact with the drain region of the device, and an additional, inventive n-body disposed in the p-well. This discovery has applicability to complementary MOS devices in general, including n- and p-channel devices referred to as DMOS, PMOS, IGBT, DGDMOS, and p-n-p transistors. Thus, when the acronym "MOS" is used herein without an additional identifying preface, the term is intended to refer to all metal-oxide semiconductor devices generally. Also, as is known, any n-channel device may be formed as a p-channel device by substituting the regions of conductivity and reversing the polarity of the charges, i.e., substituting p+ for n– and vice versa. Thus, it should be appreciated that the specific references herein to n-channel and p-channel regions are for purposes of illustration, as the concepts and device features specifically described herein may apply equally to devices of opposite-type conductivity.

Figure 1A:
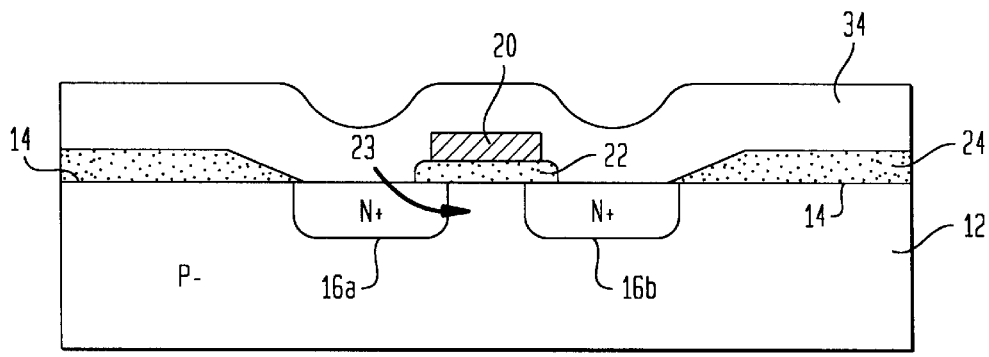
FIG. 1A is a cross-sectional view of a portion of a prior art MOS device showing basic device features.
Figure 1B:
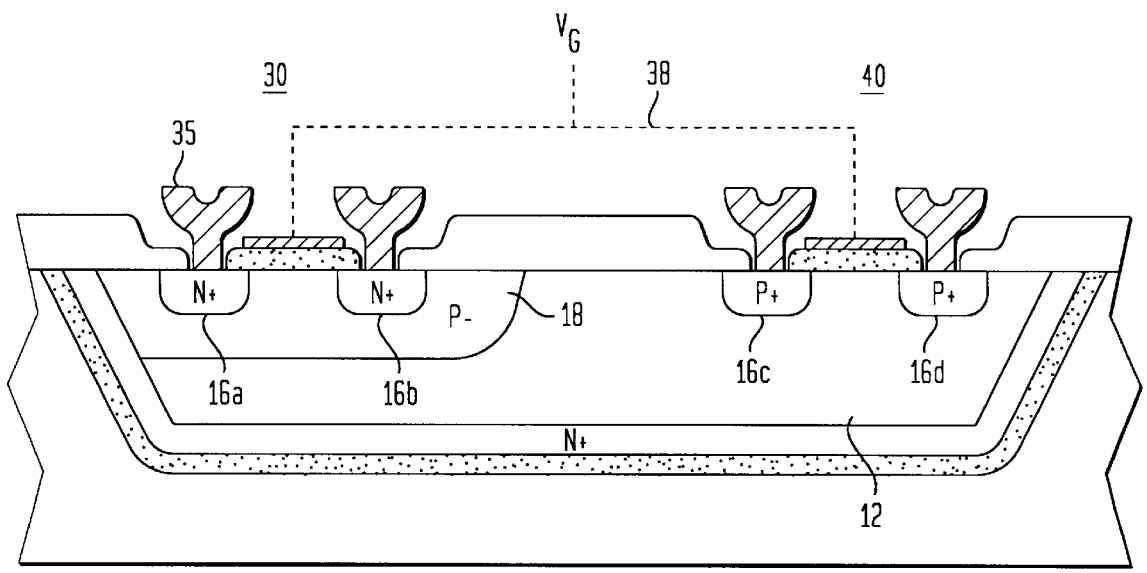
FIG. 1B is a cross-sectional view of a prior art CMOS having PMOS and NMOS portions.
Figure 2A:
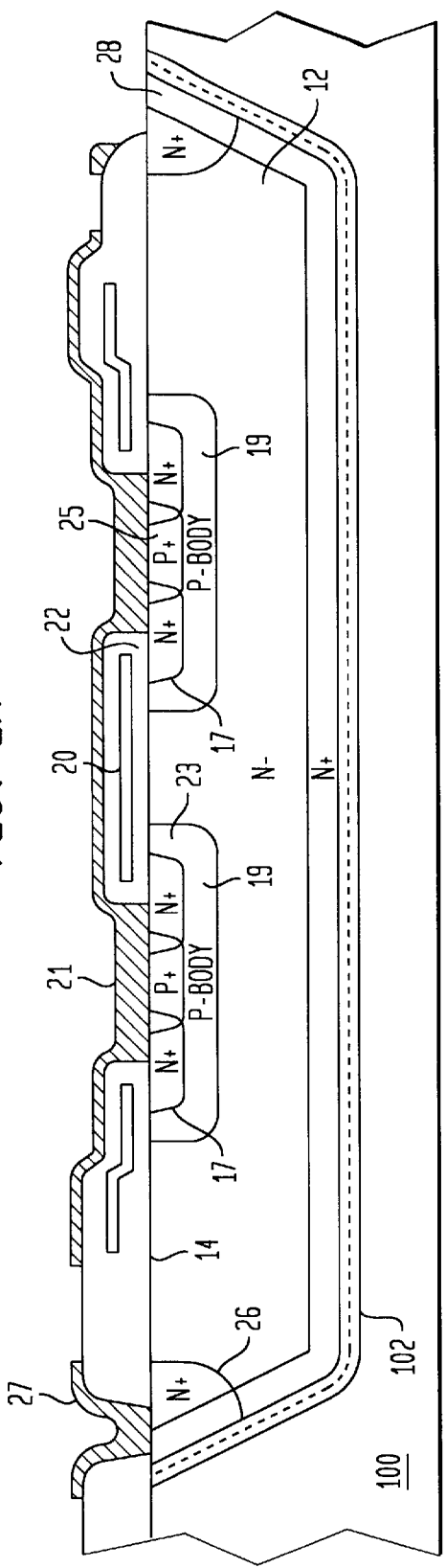
FIG. 2A is a cross-sectional view of a prior art n-channel DMOS device.
Figure 2B:
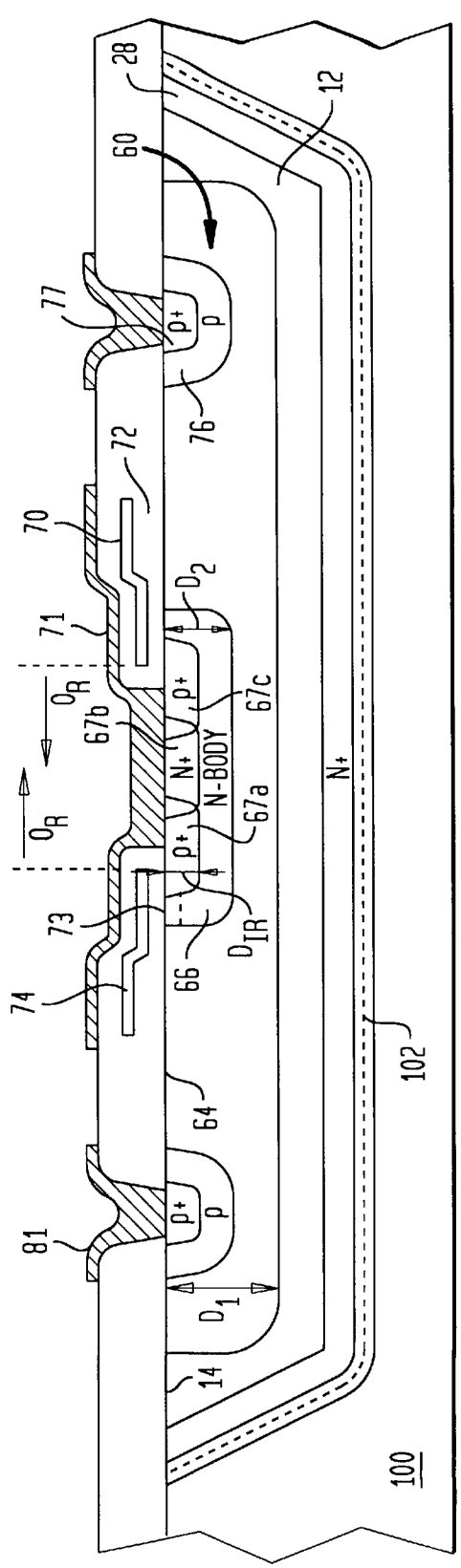
FIG. 2B is a cross-sectional view of an inventive p-channel DMOS device complementary to the n-channel device of FIG. 2A.

With reference to the figures, FIG. 2B illustrates a cross-sectional view of an inventive MOS having enhanced compatibility for use in a CMOS structure. The inventive p-channel DMOS device of FIG. 2B is complementary to the n-channel device of FIG. 2A, and it may be fabricated on the same substrate 12 and integrated simultaneously on the same chip 100 as the complementary n-channel DMOS (FIG. 2A). The general configuration and concepts illustrated in FIG. 2A may be applied to fabricate analogous IGBT, p-n-p transistor, CMOS, or medium voltage PMOS devices, which are illustrated in FIGS. 3–7 and described further below.

Referring to FIG. 2B, the substrate 12 is of a first conductivity type, shown as n-type, and may be isolated from the chip 100 by a layer of oxide or dielectric material 102, with a highly-doped n+ region 28 underlying the substrate, as with the DMOS of FIG. 2A. The substrate 12 also has a major surface 14 on which active components are disposed. A lateral lower well 60 of a second conductivity type, shown as p-type, is disposed in the substrate 12. The lower well 60 has a first depth $D_1$, thus terminating above the n-substrate to form a p-n junction. The upper boundary 64 of the lower well is contiguous the major surface; that is, it is aligned with the major surface and thereby defines a portion of it. The upper area of the lower well adjacent the boundary 64 may comprise a drain region. A first conductive region or gate electrode 70 is disposed over a portion of the major surface 14, insulated by oxide layer 72 of dielectric material. An edge of the gate electrode 74 defines an opening to the major surface, i.e., region $O_R$ which is not covered by gate 70.

A first upper well 66 is disposed in the lower well 60, and is of the first conductivity type, i.e., shown as n-type conductivity, the same conductivity type as the substrate 12, although it may have a different concentration of dopants than the substrate. It is surrounded by the p-well 60, or in other words, it has a depth $D_2$ less than the depth $D_1$ of the p-well 60, with a limited width at its upper surface area, contiguous the major surface, defining its boundary. The lateral p-well 60 may surround the bottom and sides of the first upper well 66, as shown in FIG. 2B, or it may abut only a side portion of the upper well 66, as shown in FIGS. 6A–6B. An important consideration is that the p-well 60 define a path for the flow of current of the second conductivity type (shown as p-type), from a channel 73 portion to the drain region.

The channel portion 73 is located in the first upper well adjacent and extending to the major surface 14 and disposed outside the open region OR, i.e., aligned under gate electrode 70. The channel 73 is in conductive relation with the gate 70.

A plurality of impurity regions, e.g., 67a, 67b, 67c, are disposed in the first upper well. At least one of the impurity regions (e.g., 67a), is of the second conductivity type (i.e., p-type), so that a p-n junction is formed in the first upper well 66. Impurity region 67a is basically aligned under the open region $O_R$. In contrast, the first upper well 66 extends laterally under gate electrode 70, forming channel region 73, and the lower well 60 extends even further laterally traversing the width of the gate electrode 70 and in contact with the drain extension. The impurity region of the second conductivity type (e.g., 67a) is in direct contact with the channel 73, so that current of the second conductivity type (p-type) may flow in the channel toward drain region, i.e., adjacent the upper boundary of p-well 60, thereby defining the p-channel device. Each of the impurity regions has an impurity region depth $D_{IR}$ less than the second depth; in other words, each is bounded on at least a portion of its bottom by upper well region 66.

One or more of the impurity regions, e.g., 67a, 67b, also may be surrounded on the sides by the upper well region 66, or preferably they may have one or more common or overlapping sides, as shown and described, for example, in U.S. Pat. No. 5,541,429 (FIG. 2), or U.S. Pat. No. 5,591,657 (FIG. 18). A second conductive region 71 may be disposed on the major surface and in contact with the impurity regions 67a, 67b. In the case of the DMOS p-channel device shown in FIG. 2B, second conductive region 71 defines a source electrode. In the case of a p-channel IGBT device (FIG. 3B), the conductive region 71 defines a cathode, and for a p-n-p transistor (FIG. 4B), conductive region 71 defines an emitter contact and base contact.

Looking still at FIG. 2B, in addition to the first upper well 66, at least one second upper well 76 is disposed in the lower p-well 60, with the drain region of the lower p-well (i.e., adjacent the upper boundary of the p-well) interposed between the first and second upper wells. The second upper well 76 is of the same conductivity and polarity as the p-well, but has a different doping concentration. Also, as with the first upper well 66, the second upper well 76 has a depth less than that of the first depth, which may be the same as the second depth $D_2$ but need not be. The second upper well 76 is preferably surrounded by the p-well 60 on its bottom and sides, as shown. As with the first upper well, it has an upper surface area contiguous the major surface 64 defining its width or outer boundary. At least one doped body 77 is disposed in the second upper well (the term "doped body" being used to distinguish this impurity region from the impurity region 67 in the first upper well).

In the case of the p-channel DMOS device shown in FIG. 2B, the doped body 77 is of the second conductivity type (e.g., p-type), having a different doping concentration and polarity than the second upper well 76, defining a supplemental drain region or drain extension. In the case of a p-channel IGBT, this doped body 77 may be of the first conductivity type (n-type), to form an anode region (FIG. 3B). For a p-n-p transistor (FIG. 4B), this doped body 77 is of the second conductivity type to form a collector region. A third conductive region 81 is disposed on the major surface in contact with the at least one doped body 77, for forming a drain contact (FIG. 2B), an anode of an IGBT (FIG. 3B), or a collector contact of a p-n-p transistor (FIG. 4B). A conductive conduit (not shown) may connect the gate of the inventive complementary p-channel DMOS device to an n-channel MOS device (e.g., FIG. 2B). A layer of protective glass may be deposited over the device which may further be covered by a passivation layer of silicon nitride (not shown).

As may now be appreciated, this configuration enables the formation of complementary devices which can be integrated on the same chip as corresponding n-channel devices by essentially adding one level of doping (i.e., an additional n-body), to a typical n-channel MOS fabrication process. Doubly-diffused CMOS devices thus may be fabricated while basically using n-channel processing steps. Also, the inventive technology may be applied to various types of MOS devices, e.g., p-channel DMOS, IGBT, or quasi-vertical p-n-p devices, as illustrated in the figures. For example, FIG. 3A is a cross-sectional view of an n-channel IGBT device, and FIG. 3B shows a cross-sectional view of an inventive p-channel IGBT device complementary to the device of FIG. 3A. Referring to FIG. 3B, the IGBT device is fabricated on n-type substrate 12, as with the DMOS of FIGS. 2A–2B and the n-channel IGBT of FIG. 3A. In FIG. 3B, a lateral p-well layer 60 is disposed over the substrate 12. First conductive region 70 comprises the gate, and impurity regions 67a, 67b, etc. of the first upper well layer 66 are connected via second conductive region 71 to form the cathode (C). Doped body 79 of the second upper well region 76 is of opposite-type conductivity as compared with the second upper well 76 and lower well 60, to form the anode region, with third conductive region 81 comprising the anode (A).

Figure 4A:
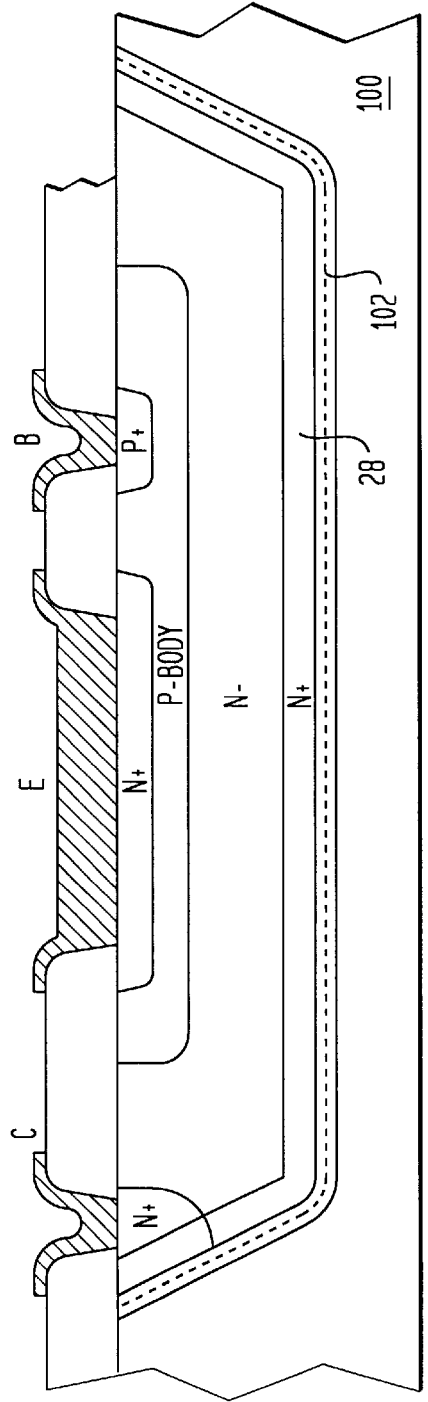
FIG. 4A is a cross-sectional view of a prior art n-p-n transistor.
Figure 4B:
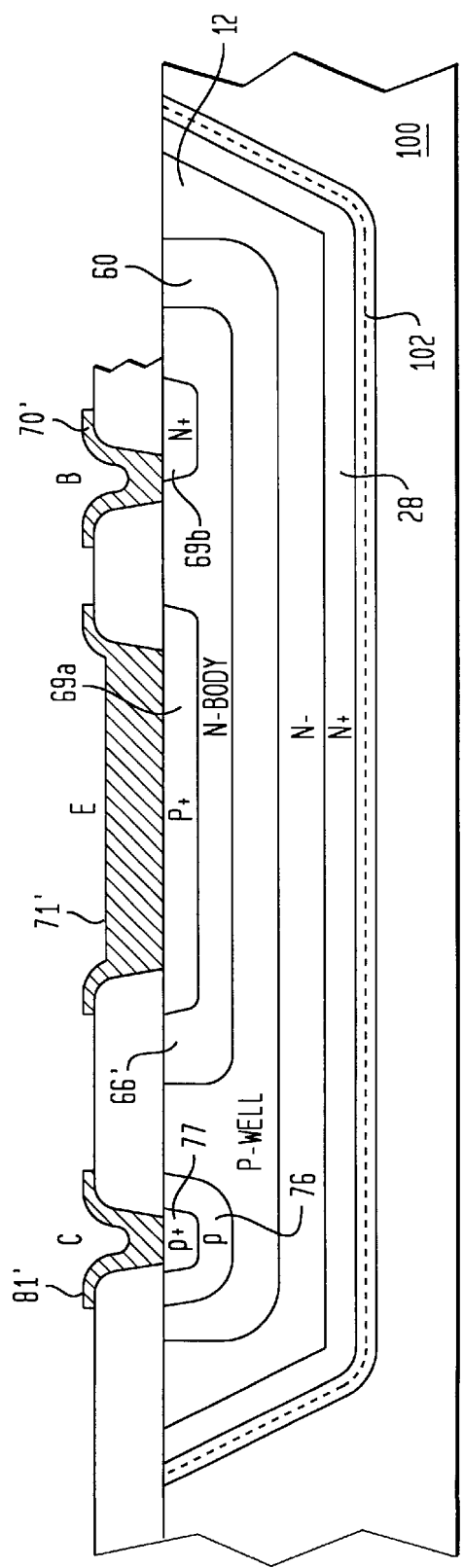
FIG. 4B is a cross-sectional view of an inventive p-n-p transistor complementary to the device of FIG. 4A.

In FIGS. 4A and 4B, there are shown cross-sectional views of an n-p-n transistor and inventive complementary p-n-p transistor, respectively. In FIG. 4B, as in FIGS. 2B and 3B, a laterally diffused p-well layer 60 is shown. An inventive an n-body region 66' is formed (the base region of the p-n-p transistor), enabling the fabrication of the complementary device in n-type substrate 12. The first upper well has first and second impurity regions 69a, 69b, for forming the emitter (E) and base (B), respectively, and the doped body 77 of the second upper well 76 forms a collector (C). First, second, and third conductive regions 70', 71', 4 and 81', form collector (C), emitter (E), and base (B) contacts, which typically will extend above the top surface of the chip (not shown).

Figure 5A:
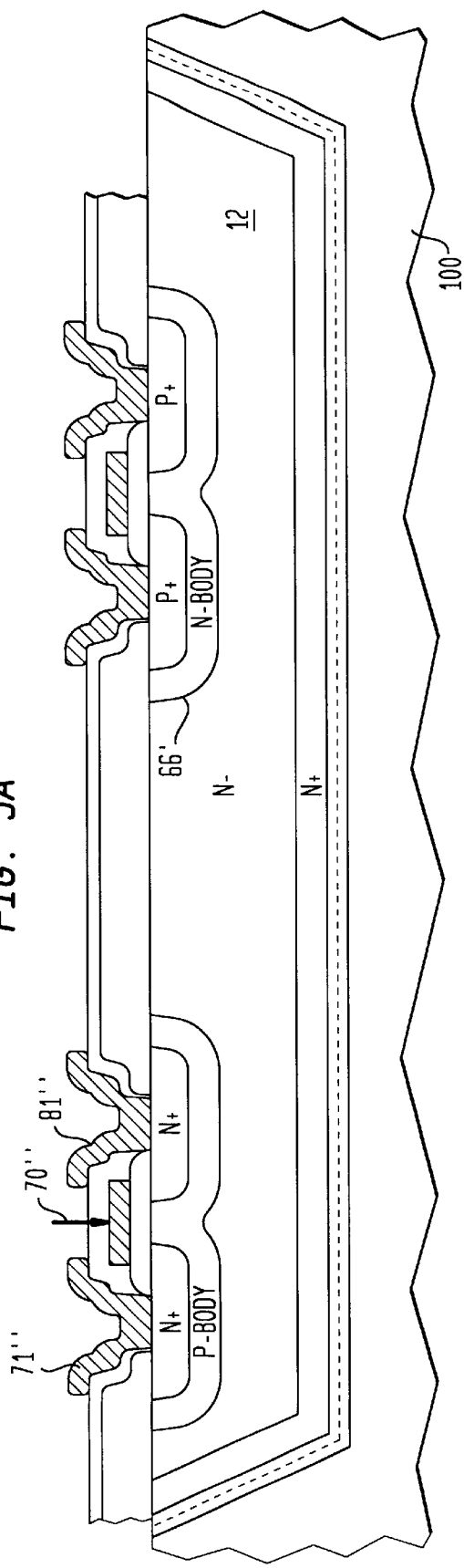
FIGS. 5A and 5B illustrate cross-sectional views of alternate embodiments of inventive CMOS structures with the threshold voltages of the PMOS and NMOS portions matching the threshold voltages of high voltage p-channel DMOS and n-channel DMOS, respectively.
Figure 5B:
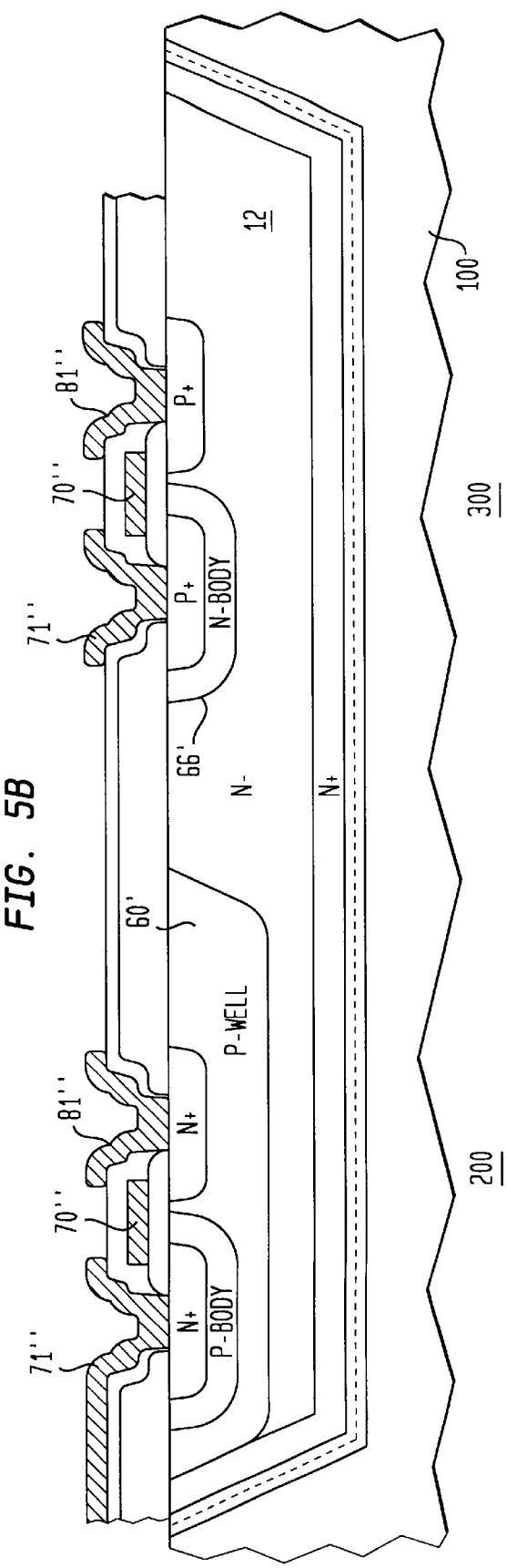

In FIGS. 5A and 5B, there are illustrated cross-sectional views of alternate embodiments of inventive CMOS structures with the threshold voltages of the NMOS (200) and PMOS (300) portions matching the threshold voltages of the high voltage p-channel DMOS and n-channel DMOS, respectively. In each case, first, second, and third conductive regions (70", 71", and 81"), form the gate, source, and drain contacts, respectively. The additional n-body (e.g., 66', 66") enables fabrication of the medium or high voltage CMOS structure.

FIGS. 6A and 6B illustrate cross-sectional views of alternate embodiments of inventive p-channel DMOS (FIG. 6A) and IGBT (FIG. 6B) devices. In these embodiments, the lateral p-well 60 comprises a first portion 60a and second portion 60b, such that a portion of the bottom $W_B$ of the first upper well 66 abuts the substrate 12, as opposed to being surrounded by the p-well 60, as in FIGS. 2B and 3B.

Figure 7A:
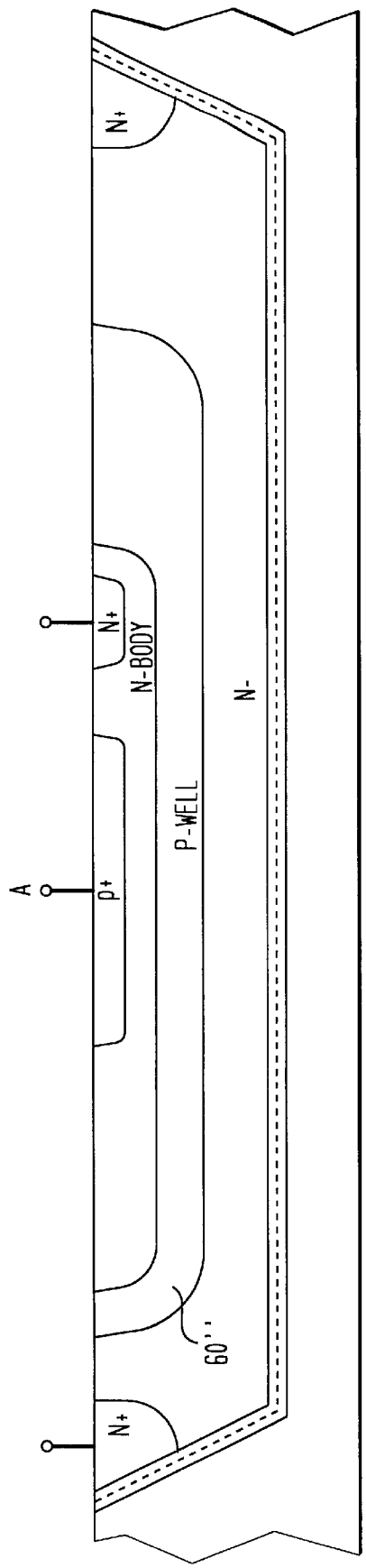
FIGS. 7A and 7B illustrate cross-sectional views of vertical (FIG. 7A) and lateral (FIG. 7B), gate-turn-off (GTO) thyristors that may be realized following the inventive process.
Figure 7B:
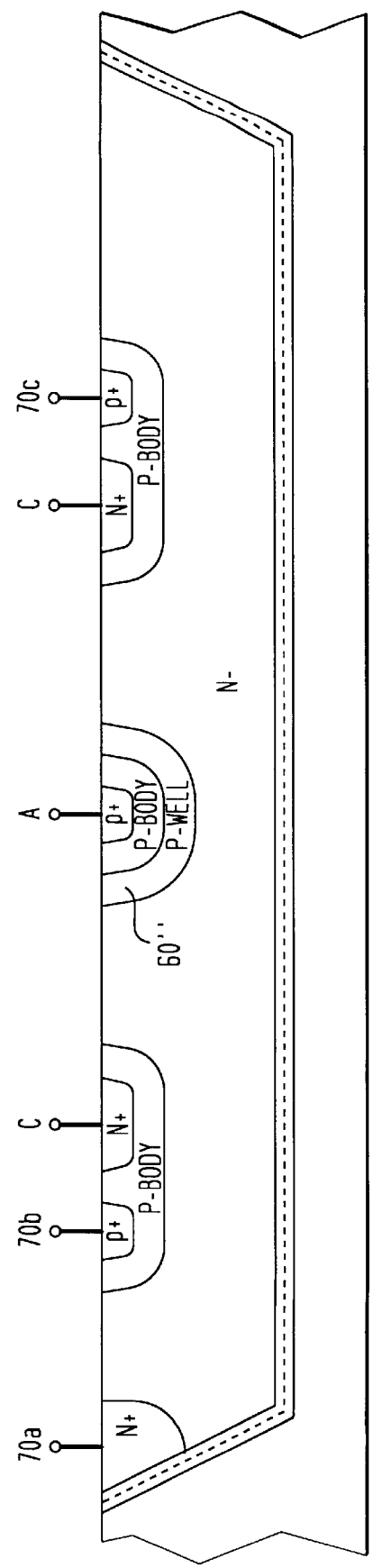

FIGS. 7A and 7B illustrate cross-sectional views of vertical (FIG. 7A) and lateral (FIG. 7B), gate-turn-off (GTO) thyristors that may be realized following the inventive technology, wherein the p-well 60" surrounds the anode (A) of the device. Lateral GTO (FIG. 7B), has a plurality of gate contacts 70a, 70b, 70c.

As may be appreciated, the inventive technology can be applied to various complementary MOS and bipolar CMOS structures, with FIGS. 2A–7B showing illustrative embodiments, and each of the devices may be integrated on a chip 100 having an n-type base region or substrate 12. The process for fabricating the inventive MOS devices is cost-effective, uses chip area efficiently, and involves a short process cycle as compared with prior methods of fabricating complementary p-channel and CMOS structures. The process can be implemented for all BiCDMOS products and push-pull stages (both analog and high voltage). The CMOS structure may be integrated on a chip having threshold voltages comparable to medium and high voltage DMOS devices.

The invention is particularly advantageous in that it enables fabrication of a CMOS structure basically by adding one implantation step to present technology involving fabrication of n-channel devices. A known fabrication sequence for making an n-channel DMOS or n-p-n transistor can be summarized as having the following masking steps: 1) deep n+ diffusion; 2) p-well body diffusion 3) field oxide formation; 4) gate oxide formation; 5) polysilicon deposition and etch (for gate formation); 6) p– type body implantation (to form the body of a double-diffused MOS or base of an n-p-n transistor); 7) p+ body implantation (to form the source or drain of the MOS or the emitter or collector region of the n-p-n transistor); 8) p-glass or boron phosphor silicate glass (BPSG) deposition; 9) contact etch; 10) metal deposition and etch; and 11) plasma nitride deposition and etch. These steps for fabricating an NMOS for an integrated circuit device are described in the symposium article and the above cited patents, which have been incorporated herein. Applicant has discovered a p-channel complementary MOS and a BiCMOS device may be fabricated essentially by adding one implantation step to these steps and enhancing the lateral diffusion of one region (i.e., p-well of step 2, above). The added implantation step involves an n-type body implantation (to form the n-body of a p-channel DMOS and IGBT, the base of a vertical p-n-p transistor, the gate of a vertical GTO thyristor, and threshold control implant for p-channel devices). In the case of making an inventive p-channel DMOS (e.g., the device of FIG. 2B), the additional implantation step advantageously is performed after the polysilicon deposition and etch (e.g., after step 5, above).

Figure 8A:
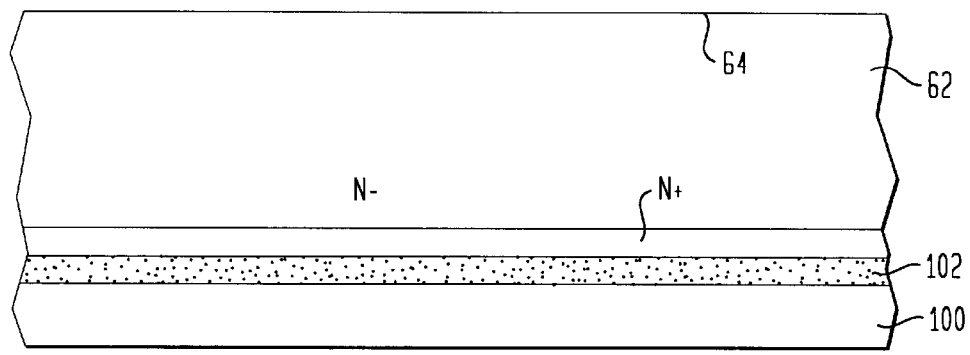
FIGS. 8A–8N are cross-sectional views showing illustrative processing steps for making a portion of an inventive MOS device.
Figure 8B:
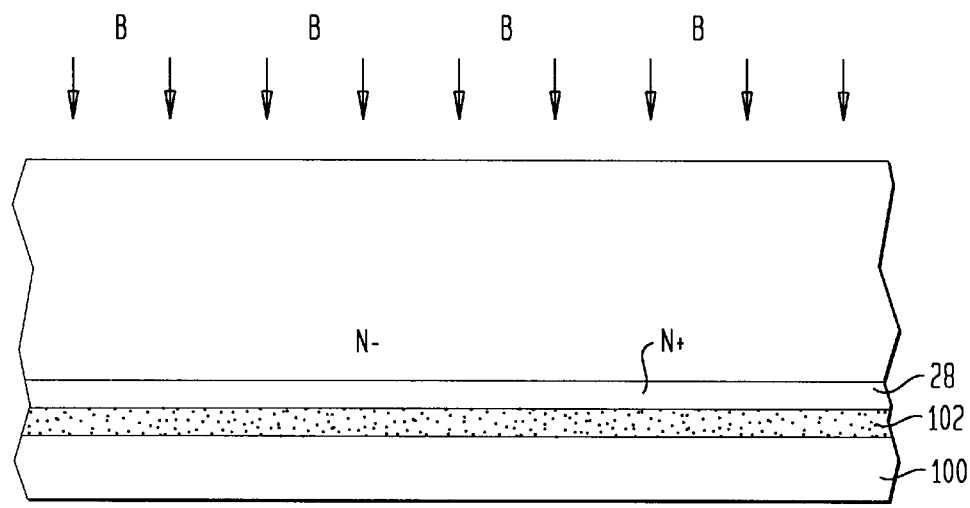

An exemplary process for making an inventive DMOS is set forth below with reference to FIGS. 8A–8N, which show sequential masking steps for one process of fabricating a portion of the p-channel DMOS device falling within region 8—8 of FIG. 2B. Of course it is to be appreciated that FIGS. 8A–8N show one way in which an inventive MOS may be fabricated for purposes of illustration, and that only a select portion of the device is shown (i.e., region 8—8, FIG. 2B), as reflected by bending vertical sides in each of these figures. It is understood this example is not limiting in nature and that variations may be made by one skilled in the art to fabricate other inventive MOS devices and transistors.

Referring to FIG. 8A, a dielectrically-isolated substrate has been prepared applying principles known in the field. For the substrate of FIG. 8A, for example, the preparation steps may include etching with KOH solution to form v-grooves, implantation of arsenic ions throughout the nonplanar surfaces, thermally growing of approximately two microns of isolation oxide on the substrate, and growing of a relatively thick (e.g., 250 μm) layer of polycrystalline silicon over the oxide. The wafer may then be flipped and polished to the required thickness to provide the substrate 62 of FIG. 8A, isolated by the layer of dielectric material 102 and having a highly-doped channel region 28. Other substrates may be used as well and altered based on the device application, as is known in the field.

The first masking step involves deep n+ diffusion, generally accomplished with phosphorus or arsenic ions to place a sinker diffusion in selected areas to define regions of contact enhancement to the n-type region. An oxide layer (not shown), also may be formed on the device also to aid in defining the regions of contact enhancement. These features are not reflected in FIG. 8A; as indicated above, the figures show a select portion of the device for purposes of illustrating a method of making the inventive MOS. Illustrated in FIGS. 8B–8C, the next masking step involves forming p-well 60 (e.g., FIG. 8C). This may be accomplished by diffusion with boron ions (e.g., arrows "B" of FIG. 8B).

Figure 8C:
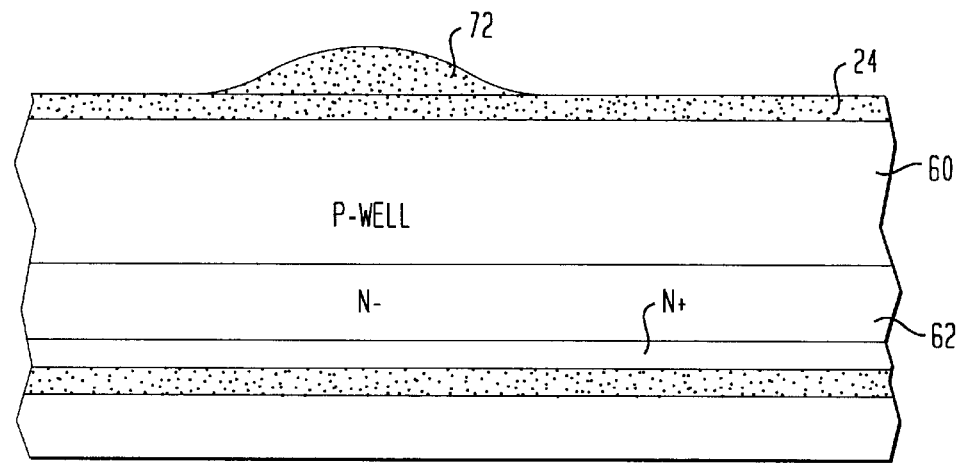
Figure 8D:
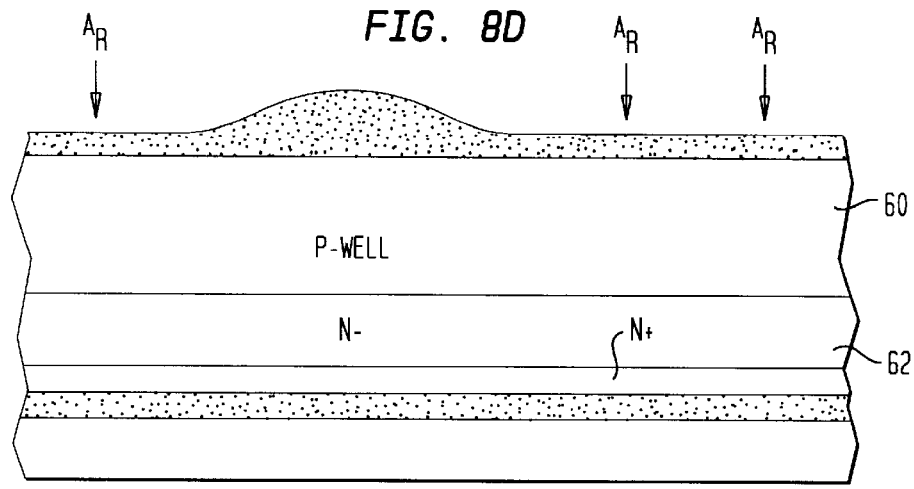

In FIG. 8C, the third and fourth steps are illustrated. They involve depositing a blanket layer of oxides 24 and a confined gate oxide layer 72 over the substrate 62, to form the field oxide layer and gate oxide layers, having desired thicknesses. Typically, the oxide layers comprise silicon dioxide, but other materials may be used as well, as are known in the field. Various techniques are described in the above cited patents and will be apparent to those skilled in the art for applying such layers. As illustrated in FIG. 8D, thin oxide regions define the active region ($A_R$) of the device.

Figure 8E:
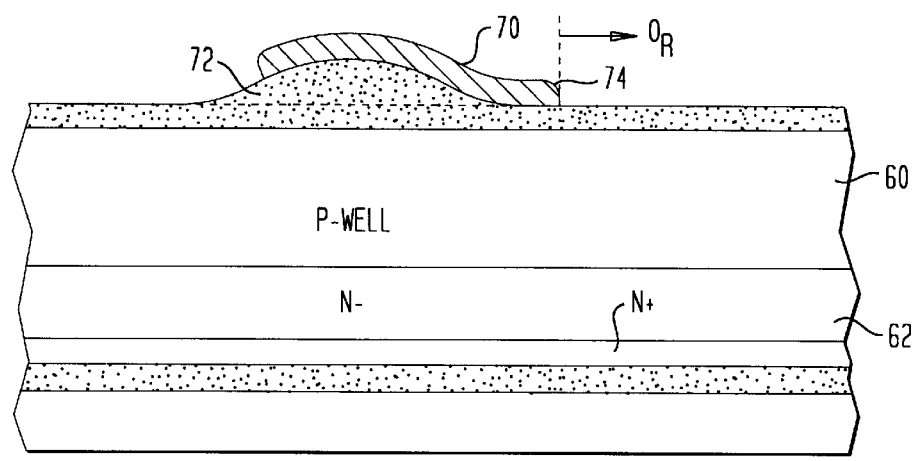

FIG. 8E illustrates the next masking step of depositing a polysilicon layer 70 over a portion of the major surface to define a gate electrode. The polysilicon may be deposited using low pressure CVD and may be doped to n+ type conductivity using one of several techniques, such as ion implantation or in situ doping with phosphorus. However, the polysilicon layer also may be undoped or doped with a p-type conductivity. The polysilicon may be patterned by plasma etching through a photoresist mask, overlying oxide layers 24, 72. It has vertical edge 74 extending beyond gate oxide layer 72, which is useful in defining an open area $O_R$, a self-alignment tool in forming doped bodies within the substrate.

Figure 8F:
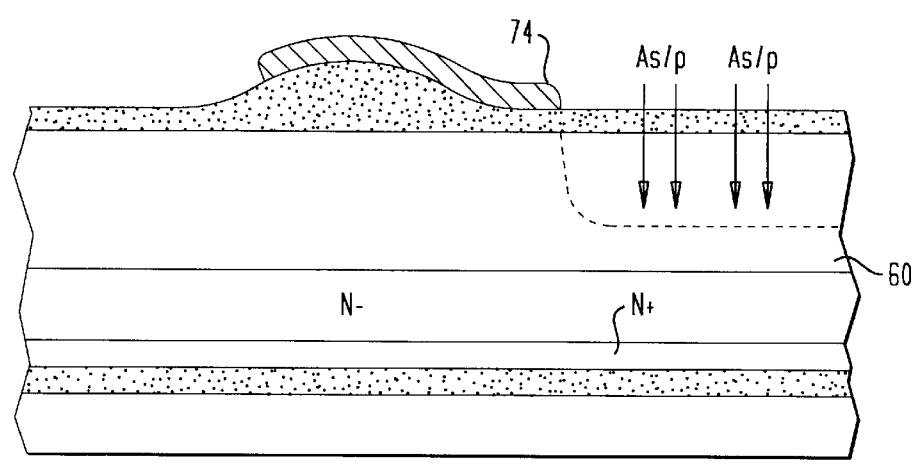
Figure 8G:
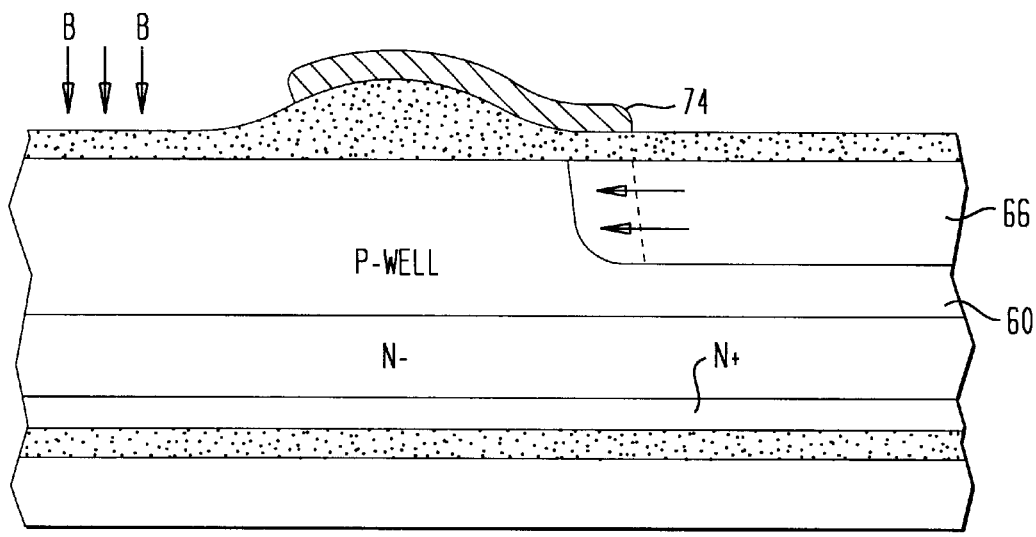
Figure 8H:
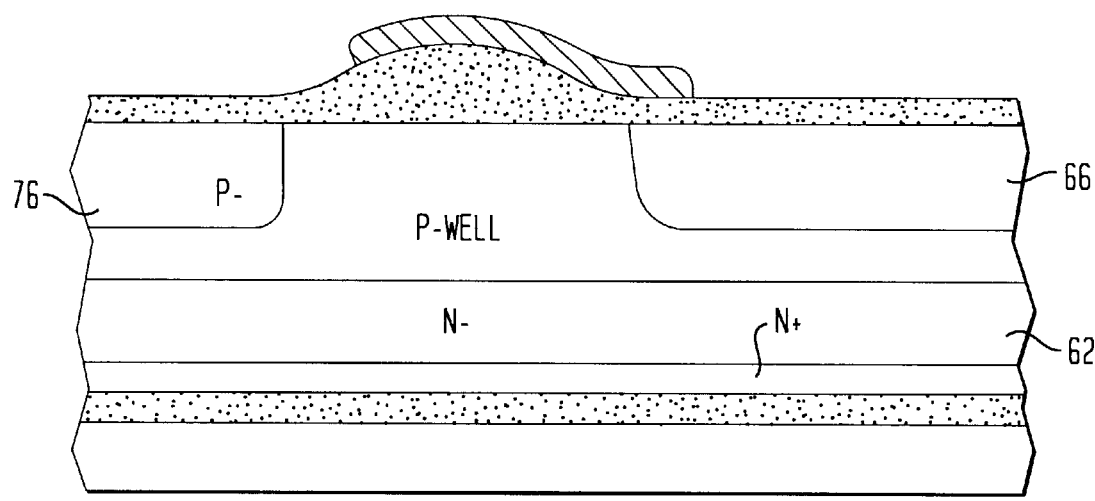

The sixth masking step, illustrated in FIGS. 8F and 8G, comprises implanting or diffusing n-type dopants in the p-well region 60, using vertical edge 74 of the polysilicon layer as an alignment body (FIG. 8F), and then laterally diffusing the dopants to form the n-body 66 (FIGS. 8G–8H). The oxide layer is sufficiently thin that n- and p-type ions may pass through it and penetrate the major surface 64, thereby forming underlying doped regions 66, 76, etc. The lateral diffusion may be performed by annealing the structure at elevated temperatures, as is known to those skilled in the field. The p-body 76 may then be formed, as illustrated with FIGS. 8G and 8H, which likewise may be accomplished by implanting p-type ions (e.g., with boron).

Figure 8I:
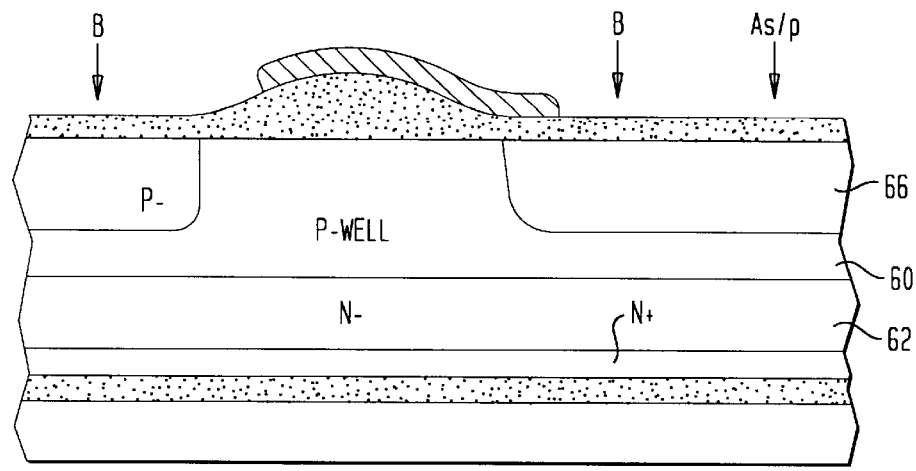
Figure 8J:
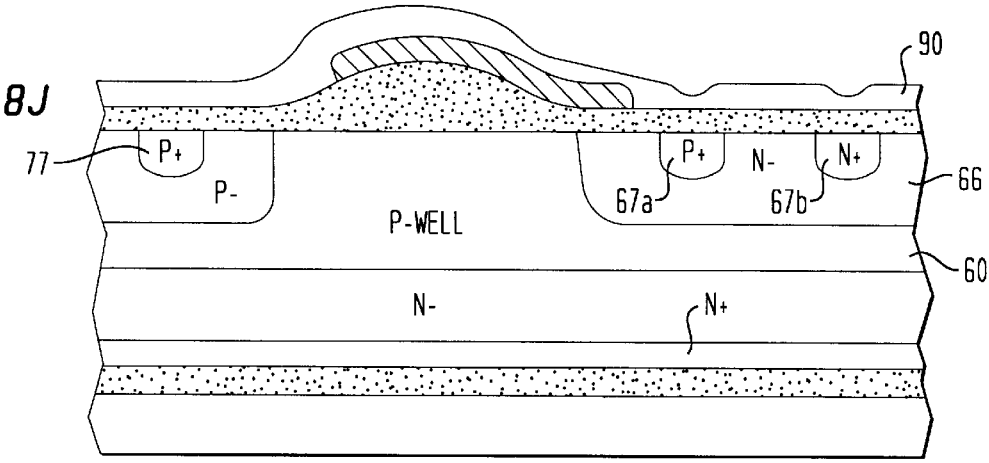
Figure 8K:
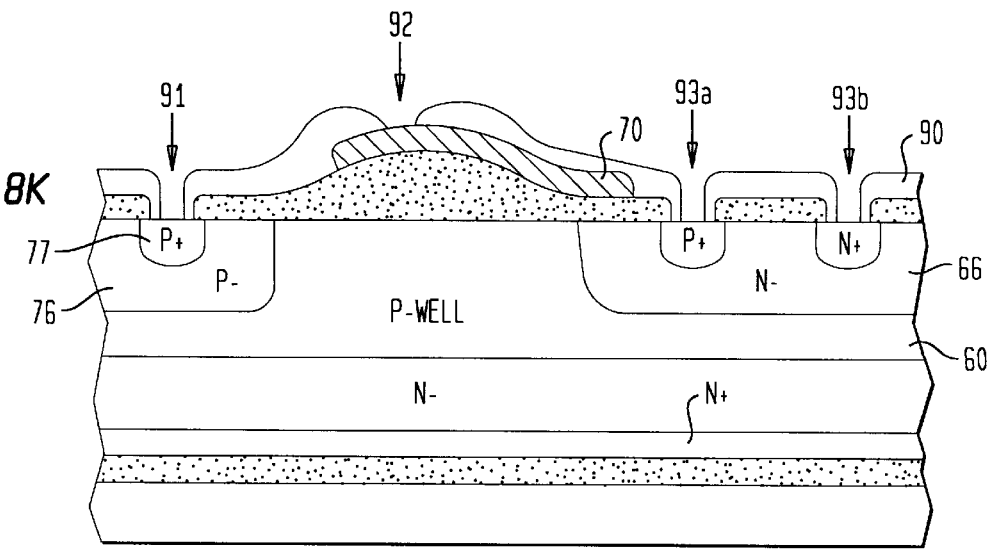

The next masking steps involve implantation of p-type and n-type ions (FIG. 8I), to form the p+ and n+ impurity bodies, 67a, 67b, etc., and p+ doped body 77 (FIG. 8J). The order in which these implantations are performed is not important. FIG. 8K shows impurity bodies 67a, 67b, separated by a portion of the upper well 66, though preferably the bodies will be overlapping as in FIG. 2B. The n+ impurity 67 may be implanted before the p+ region 77, or vice versa. The p-well 60 may be implanted and diffused after implantation of the first upper well or n-type body 66, so that it is interposed between the source and drain regions but does not fully underlie the first upper well 66, as shown in FIGS. 6A–6B. An important consideration is that the p-well 60 be diffused or implanted laterally to be interposed between portions of the first and second upper wells 66, 76.

A layer of protective glass 90 (FIG. 8J), may be deposited on the structure. A blanket layer of boron phosphorus silicate glass may be deposited by LPCVD over the exposed upper surfaces and densified. As illustrated in FIG. 8K, the glass may then be anisotropically patterned by applying a plasma etch through openings in a photoresist mask (not shown). This etchant step may be applied to simultaneously etch away portions of field oxide layer directly beneath the etched portions of the glass 90. In any case, etching of the glass and/or field oxide layer forms contact windows 91, 92, 93a, 93b (FIG. 8K), above portions of the impurity regions 67a, 67b, doped body 77, and polysilicon layer 70.

Figure 8L:
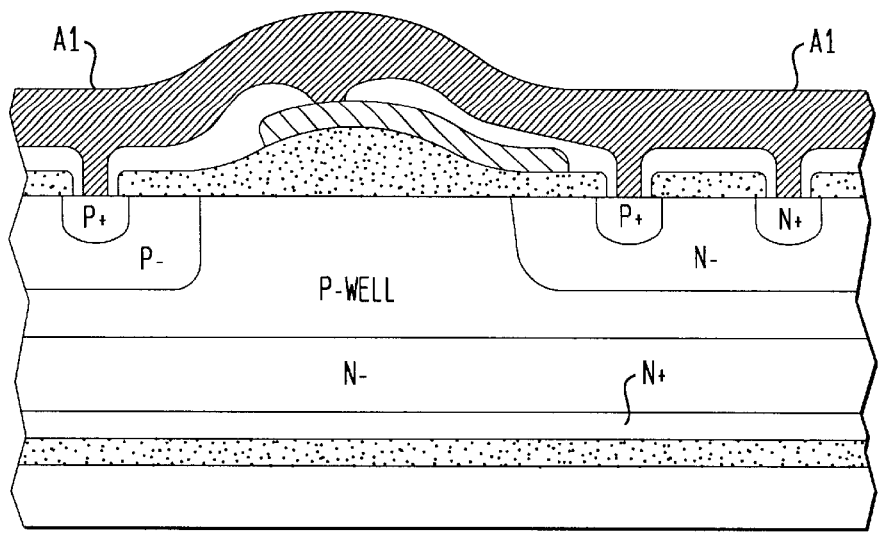
Figure 8M:
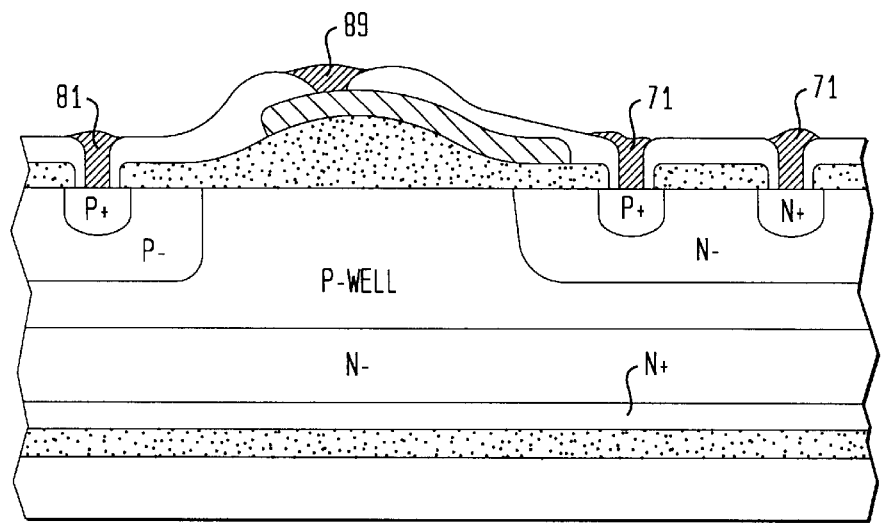
Figure 8N:
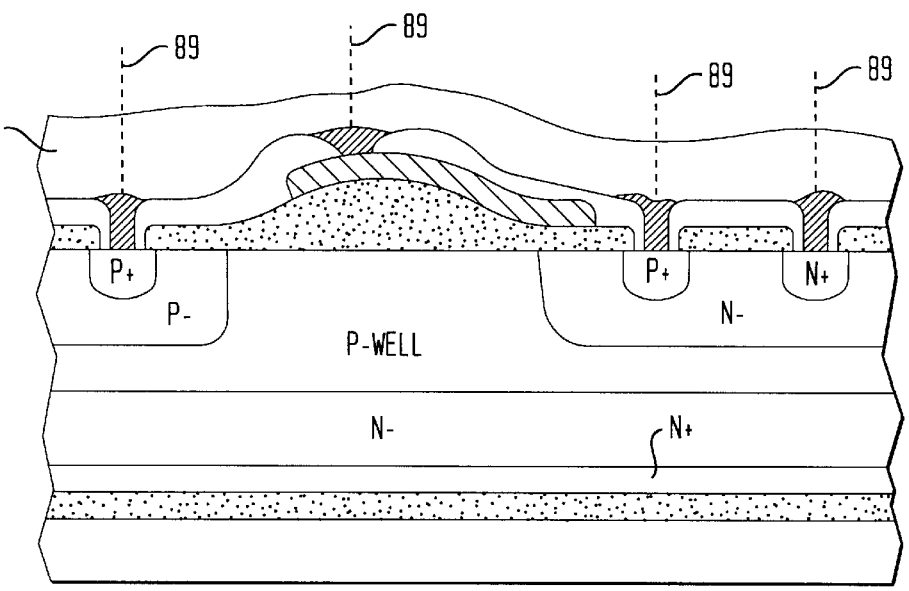

Next, a blanket layer of metal (e.g., aluminum) may be deposited over the exposed upper surface, e.g., by sputtering (FIG. 8L). Portions of the metal layer may be removed by plasma etching (i.e., with a photoresist mask), outside the area of the contact windows to form terminals 71, 81, 89 (FIG. 8M). The terminals enable electrical coupling of the doped regions 67, 77, and polysilicon gate 70, as well as coupling of the p-channel and n-channel gates of the CMOS, if desired. The terminals may be interconnected by additional metallization to other circuits in an integrated circuit, shown schematically in FIG. 8N with hatched lines 89. Lastly, a layer of nitride 104 (FIG. 8N), such as silicon nitride, may be deposited on the exposed upper surface of the structure and removed at portions (not shown) using a plasma etch through a photoresist mask (not shown), for making interconnections between the circuits. This nitride layer provides a passivation layer.

As may be appreciated, this processing sequence is similar to that for fabricating an n-channel DMOS, such as, for example, the sequence described in the symposium article, except that the p-well layer implanted into the device is disposed under the gate electrode and an additional n-body is implanted. Of course, many changes and modifications to the above fabrication steps also will be readily apparent to those of ordinary skill in the art. For example, opposite conductivity semiconductor devices can be constructed by interchanging the n-doped regions with p-doped regions, and vice versa. Other dielectric materials or protective dielectrics may replace silicon dioxide, glass, and silicon nitride; other conductive electrodes may replace polysilicon; and other conductive terminals may replace aluminum terminals. The passivation layer may be omitted, thereby reducing the processing steps. Also, the processing of wafers to simultaneously form a plurality of individual, dielectrically isolated DMOS devices within integrated circuits is well known, and it is to be appreciated that one skilled in the art may apply and modify such methods to simultaneously fabricate a plurality of the inventive devices described herein. Further, other configurations of the p+ regions and n+ source regions may be contemplated and other diffusion techniques applied, which still would fall within the scope of the present invention. Additional details and preferred methods and materials for performing various process steps are set forth in the above-cited patents which have been incorporated herein by reference.

It is understood that while the present invention has been described in terms of several illustrative embodiments, other arrangements and methods will be apparent to those of ordinary skill in the art. For example, although the inventive method is described principally with regard to a p-channel DMOS for fabrication on the same chip as an n-channel DMOS device, it can be appreciated that the method may be applied to other MOS devices, such as IGBT, DGDMOS, n-p-n transistors, p-n-p transistors, JFET, gate turn-off thyristors or MOS controlled thyristors, and so forth. The examples described herein are for illustrative purposes only and are not to be construed as limiting the scope of the invention which is delineated in the appended claims.

I claim:

1. A DMOS or IGBT device having a p-channel the device comprising:

an n-type substrate having a first doping concentration, the upper boundary of which defines a major surface;

a lateral lower p-well in the substrate, the lateral lower p-well having a graded doping density profile and having a first depth, the lower and side boundaries of the lower well surrounded by the n-type substrate and the upper boundary of the lower well being contiguous the major surface, wherein an area of the lateral lower p-well adjacent the major surface defines a drain region, a gate electrode disposed on a portion of the major surface, the gate electrode having an edge defining an opening to the major surface;

an upper n-region disposed in the substrate contiguous the lower well, the upper n-region having a second depth less than that of the first depth and an upper surface area contiguous the major surface;

at least two impurity bodies disposed in the upper n-region, at least one of the impurity bodies being of n-type conductivity and another of the impurity bodies being of p-type conductivity, each of the at least two impurity bodies having a depth less than the second depth, the p-type impurity being in direct contact with the channel for the flow of p-type current in the channel;

a first conductive region disposed on the major surface in conductive relation with the at least two impurity bodies;

a second upper well of p-type conductivity disposed in the lower well, the second upper well having a different doping concentration than the lower well, the second upper well further having a third depth less than that of the first depth and an upper surface area contiguous the major surface defining a second upper well boundary, a doped body disposed in the second upper well having a concentration of dopants or conductivity type different from that of the second upper well, and a second conductive region disposed on the major surface in conductive relation with the doped body;

wherein the channel extends from the p-type impurity region in conductive relation with the gate electrode along a portion of the upper n-region to the drain region of the lateral lower p-well, the channel forming a passage for the flow of current from the p-type impurity region to the lateral lower p-well to define a p-channel semiconductor device having the n-type substrate so that a CMOS device including an n-channel DMOS or IGBT device and said p-channel DMOS or IGBT device can be formed on the same substrate.

2. The device of claim 1, in which the lateral lower p-well surrounds the upper n-type region on its bottom and sides.

* * * * *